(12) United States Patent
Hariharan et al.

(10) Patent No.: US 10,302,704 B2
(45) Date of Patent: May 28, 2019

(54) METHOD AND BATTERY SYSTEM PREDICTING STATE OF CHARGE OF A BATTERY

(71) Applicant: Samsung Electronics Co., Ltd., Suwon-si (KR)

(72) Inventors: Krishnan S Hariharan, Bangalore (IN); Priya Gambhire, Bangalore (IN); Tae Won Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 60 days.

(21) Appl. No.: 15/235,663

(22) Filed: Aug. 12, 2016

(65) Prior Publication Data
US 2017/0052228 A1    Feb. 23, 2017

(30) Foreign Application Priority Data
Aug. 20, 2015  (IN) .............. 4354/CHE/2015

(51) Int. Cl.
*G01R 31/36* (2019.01)
*H01M 10/48* (2006.01)
*H01M 10/42* (2006.01)

(52) U.S. Cl.
CPC ........ *G01R 31/3651* (2013.01); *H01M 10/48* (2013.01); *H01M 10/484* (2013.01); *H01M 10/425* (2013.01); *H01M 2010/4271* (2013.01)

(58) Field of Classification Search
CPC combination set(s) only.
See application file for complete search history.

(56) References Cited

U.S. PATENT DOCUMENTS

| | | | |
|---|---|---|---|
| 7,684,941 B2 | 3/2010 | Seo et al. | |
| 2005/0052810 A1* | 3/2005 | Suntio | H01M 10/44 361/115 |
| 2010/0085057 A1* | 4/2010 | Nishi | G01R 31/3651 324/427 |
| 2012/0328942 A1* | 12/2012 | Thomas-Alyea | H01M 4/587 429/211 |
| 2013/0119921 A1 | 5/2013 | Choe et al. | |

(Continued)

FOREIGN PATENT DOCUMENTS

| | | |
|---|---|---|
| JP | 2012-141202 A | 7/2012 |
| JP | 2013-140037 A | 7/2013 |

(Continued)

OTHER PUBLICATIONS

Subramanian, et al. "Efficient Macro-Micro Scale Coupled Modeling of Batteries." *Journal of the Electrochemical Society* 152.10 (2005): A2002-A2008.

(Continued)

*Primary Examiner* — Vincent Q Nguyen
(74) *Attorney, Agent, or Firm* — NSIP Law (57) ABSTRACT

A method and apparatus for predicting a state of charge (SoC) of a battery includes estimating an open circuit voltage of the battery based on an open current voltage model, where the open current voltage model is defined by internal parameters that are derived from a battery voltage of the battery, a load current of the battery for a load, or a first SoC of the battery, or any combination thereof; and predicting a second SoC based on the estimated open current voltage.

21 Claims, 6 Drawing Sheets

(56) References Cited

U.S. PATENT DOCUMENTS

| | | | |
|---|---|---|---|
| 2013/0317771 A1 | 11/2013 | Laskowsky et al. | |
| 2014/0159736 A1* | 6/2014 | Morimoto | G01R 31/3679 324/426 |
| 2014/0217987 A1 | 8/2014 | Shim et al. | |
| 2014/0236511 A1 | 8/2014 | Kulkarni et al. | |
| 2015/0260800 A1* | 9/2015 | Baba | G01R 31/3651 702/63 |
| 2016/0204639 A1* | 7/2016 | Honkura | H02J 7/0068 429/50 |

FOREIGN PATENT DOCUMENTS

| KR | 10-0805116 B1 | 2/2008 |
|---|---|---|
| KR | 10-2013-0134982 A | 12/2013 |
| KR | 10-2014-0082752 A | 7/2014 |
| KR | 10-2014-0100086 A | 8/2014 |
| KR | 10-2014-0133318 A | 11/2014 |
| KR | 10-2015-0019190 A | 2/2015 |

OTHER PUBLICATIONS

Dubarry, et al. "Incremental Capacity Analysis and Close-To-Equilibrium OCV Measurements to Quantify Capacity Fade in Commercial Rechargeable Lithium Batteries." *Electrochemical and solid-state letters* 9.10 (2006): A454-A457.

Smith, et al. "Model-Based Electrochemical Estimation of Lithium-Ion Batteries." *2008 IEEE International Conference on Control Applications*. IEEE, 2008.

Di Domenico, et al. "Lithium-ion battery state of charge estimation with a Kalman filter based on a electrochemical model." *2008 IEEE International Conference on Control Applications*. Ieee, 2008.

Cai, et al. "Reduction of Model Order Based on Proper Orthogonal Decomposition for Lithium-Ion Battery Simulations," *Journal of the Electrochemical Society* 156.3 (2009): A154-A161.

Subramanian, et al. "Mathematical Model Reformulation for Lithium-Ion Battery Simulations: Galvanostatic Boundary Conditions." *Journal of the Electrochemical Society* 156.4 (2009): A260-A271.

Windarko, et al. "SOC Estimation Based on OCV for NiMH Batteries Using an Improved Takacs Model." *Journal of Power Electronics* 10.2 (2010): 181-186.

Dao, Thanh-Son, et al, "Simplification and Order Reduction of Lithium-Ion Battery Model Based on Porous-Electrode Theory." Journal of Power Sources 198 (2012): 329-337.

Bartlett, et al. "Model-Based State of Charge Estimation and Observability Analysis of a Composite Electrode Lithium-Ion Battery." *52nd IEEE Conference on Decision and Control*. IEEE, 2013.

Baba, et al. "Numerical Simulation of Thermal Behavior of Lithium-Ion Secondary Batteries Using the Enhanced Single Particle Model." *Journal of Power Sources* 252 (2014): 214-228.

\* cited by examiner

METHOD AND BATTERY SYSTEM PREDICTING STATE OF CHARGE OF A BATTERY

CROSS-REFERENCE TO RELATED APPLICATION(S)

This application claims the benefit under 35 USC § 119(a) of Indian Patent Application No. 4354/CHE/2015, filed on Aug. 20, 2015, in the Indian Patent Office, the entire disclosure of which is incorporated herein by reference for all purposes.

BACKGROUND

1. Field

The following description relates to a method and battery system predicting State of Charge (SoC) of a battery.

2. Description of Related Art

Lithium ion (Li-ion) batteries are used in wide variety of applications due to their low weight, high energy density and slow discharge rate. A Li-ion battery (hereafter referred to as "battery") is generally used in devices such as mobile phones, digital cameras, robotic vacuum cleaners, lawn mowers and electric vehicles. The operation of these devices is substantially dependent on battery power derived from the battery. Thus, updating a user of a device with a present status of the battery is beneficial for enabling the user to seamlessly operate the device.

One of the parameters that may be indicated to the user to indicate the current battery status is a state of charge (SoC) of the battery. For a lithium ion cell or a Li-ion battery, a true SoC would be a measure of the lithium available in electrodes of the battery for chemical reaction to produce electricity. However, the lithium inside the cell is not a measurable quantity. Accordingly, techniques typically equate cell information, such as current, as an estimate of SoC. The estimation of SoC may depend on knowledge of battery capacity. However, the total capacity of the battery decreases while in operation, due to repeated cycling. Capacity fade can be due to side reactions like solid-electrolyte interphase (SEI) film formation. The effects of the side reactions on capacity loss may be considered in such SoC estimations. However, due to ageing, an Open Circuit Voltage (OCV) of the battery can change and may also need or be desirable to be considered during SoC estimation. Another existing technique estimates the SoC based on a charge current, a discharge current, and an output voltage using a nonlinear optimization that expresses a relationship between the SoC and an open circuit voltage (OCV). However, this existing technique utilizes a combination of a nonlinear adaptive filter along with a single particle model (SPM). This filter introduces artificial parameter dependencies and physics. Thus, the filter alters values of parameters of the OCV and the SoC, for matching the measured voltage that may not be reliable or accurate. Further, this existing technique describes the SoC estimation for fresh cells or batteries and does not consider effects on the battery OCV due to aging. Thus, the existing techniques may not provide true SoC estimation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for predicting a state of charge (SoC) of a battery includes estimating an open circuit voltage of the battery based on an open current voltage model, where the open current voltage model is defined by internal parameters that are derived from a battery voltage of the battery, a load current of the battery for a load, or a first SoC of the battery, or any combination thereof; and predicting a second SoC based on the estimated open current voltage.

An effect of aging on the battery may be determined based on the estimated open current voltage.

The first SoC may be an initial state of charge of the battery and may be derived from an initial surface concentration of ions of a positive electrode or a negative electrode of the battery.

The method may further include deriving the internal parameters, such as reaction fluxes at a positive electrode and a negative electrode, interfacial potentials in an electrolyte phase at the positive electrode and the negative electrode, reaction rates at the positive electrode and the negative electrode, an open circuit potential of the positive electrode, a side reaction current density of the battery, or a resistance of a solid-electrolyte interphase film formed at the negative electrode, or any combination thereof. The interfacial potentials in the electrolyte phase at the positive electrode and the negative electrode may be based on interfacial electrolyte concentrations at the positive electrode and the negative electrode and interfacial mass fluxes at the positive electrode and the negative electrode, wherein the interfacial electrolyte concentrations and interfacial mass fluxes may be based on the load current. The reaction fluxes at the positive electrode and the negative electrode may be based on the load current. The side reaction rate and the solid-electrolyte interphase film resistance may be determined from the battery voltage and the load current. The reaction rates at the positive electrode and the negative electrode and the open circuit potential of the positive electrode may be determined from a surface concentration of ions in the positive electrode and the negative electrode, wherein the surface concentration of ions in the negative electrode may be determined from the determined initial surface concentration of ions in the negative electrode or a determined current surface concentration of ions in the negative electrode, or both.

The second SoC may be predicted based on the open current voltage using the open circuit potential of the negative electrode, wherein the open circuit potential of the negative electrode may be used to determine the current surface concentration of the negative electrode.

The method may further include displaying the second SoC and a remaining battery life of the battery on a user interface.

In another general aspect, a battery system for predicting a State of Charge (SoC) of a battery includes a battery management controller, and the battery connected to a load and a battery management controller. The battery management controller is configured to estimate an open circuit voltage of the battery based on an open current voltage model defined by internal parameters, wherein the internal parameters are determined from a battery voltage of the battery, a load current of the battery, or a first SoC of the battery, or any combination thereof, and predict the second SoC from the open circuit voltage.

The battery management controller may be further configured to determine an effect of aging on the battery based on the open current voltage The first SoC may be an initial SoC of the battery and may be derived from a determined initial surface concentration of ions in one of a positive electrode and a negative electrode of the battery.

The internal parameters may include reaction fluxes at a positive electrode and a negative electrode, interfacial potentials in an electrolyte phase at the positive electrode and the negative electrode, reaction rates at the positive electrode and the negative electrode, an open circuit potential of the positive electrode, a side reaction current density of the battery, or a resistance of a solid-electrolyte interphase film formed at the negative electrode, or any combination thereof.

The interfacial potentials in the electrolyte phase at the positive electrode and the negative electrode may be determined based on interfacial electrolyte concentrations at the positive electrode and the negative electrode and interfacial mass fluxes at the positive electrode and the negative electrode, wherein the interfacial electrolyte concentrations and interfacial mass fluxes may be determined based on the load current.

The battery management controller may be further configured to determine the reaction fluxes at the positive electrode and the negative electrode based on the load current.

The battery management controller may be configured to determine the side reaction rate and the solid-electrolyte interphase film resistance based on the battery voltage and the load current.

The battery management controller may be further configured to determine the reaction rates at the positive electrode and the negative electrode and the open circuit potential of the positive electrode based on a surface concentration of ions in the positive electrode and the negative electrode, wherein the surface concentration of ions in the negative electrode may be derived from the determined initial surface concentration of ions in the negative electrode or a determined current surface concentration of ions in the negative electrode, or both.

The battery management controller may be further configured to predict the second SoC based on the open circuit voltage using the open circuit potential of a negative electrode, wherein the open circuit potential of the negative electrode is used to determine the current surface concentration of the negative electrode.

The battery system may further include a display, wherein the battery management controller may be further configured to display the second SoC and a remaining battery life of the battery on a user interface of the display. The battery management controller may be further configured to predict the second SoC of the battery by further predicting a load on the battery from the battery management controller.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The embodiments herein provide a method and a battery system that predicts a State of Charge (SoC) of a battery based an Open Circuit Voltage (OCV) model. The OCV model provides estimation of the SoC in terms of actual ion concentration present in the electrodes of the battery, thus providing a more accurate physics based prediction of the SoC. The battery system includes a battery management model that can be configured to predict the SoC of the battery by estimating an OCV of the battery based on the OCV model. The prediction of the SoC from the OCV is based on the functional dependence of the SoC on the OCV. The OCV model proposed by the battery system is defined by a plurality of internal parameters that are derived from one or more internal parameters including an output voltage of the battery, a load current supplied by the battery to a load, and an initial SoC, for example. Since the internal parameters derived are based on real time values of the output voltage, the load current along with the initial SoC, the battery system provides a real time prediction of the SoC of the battery. Since the output voltage is considered for SoC computation along with the load current, the battery system includes the battery cell aging effects during the SoC prediction and provides more accurate prediction of the SoC with aging of the battery.

The OCV model-based SoC prediction is semi-analytical, which is computationally economical and hence may consume less computational power. The reduced computational power usage enables the usage of the onboard battery system (for example, onboard of an electric vehicle or a mobile device) where reduced power consumption is an advantage. The OCV model considers most if not all electrochemical processes during the OCV estimation; hence the battery system based on the OCV model can be applied for batteries that undergo higher charging and discharging rates. Thus, changes in the electrochemical processes due to higher charging or discharging rates can be taken into account by the OCV model, effectively providing more accurate, real time SoC prediction.

Further, the battery system can be configured to indicate a health of the battery to a user through a User Interface (UI). For example, the battery health can be indicated in terms of real time SoC of the battery, and change in initial capacity of the battery with cycling. Thus, the battery system may enhance the user experience by keeping the user updated about the status of the battery.

In an embodiment, the battery is a lithium-ion (Li-ion) battery such as a Lithium Nickel Cobalt Aluminum positive electrode (Li NCA) battery, for example only. Further, the battery may include any secondary battery like Nickel Metal Hydride, Sodium ion, or Lithium-air battery, as further non-limiting examples.

Figure 1:
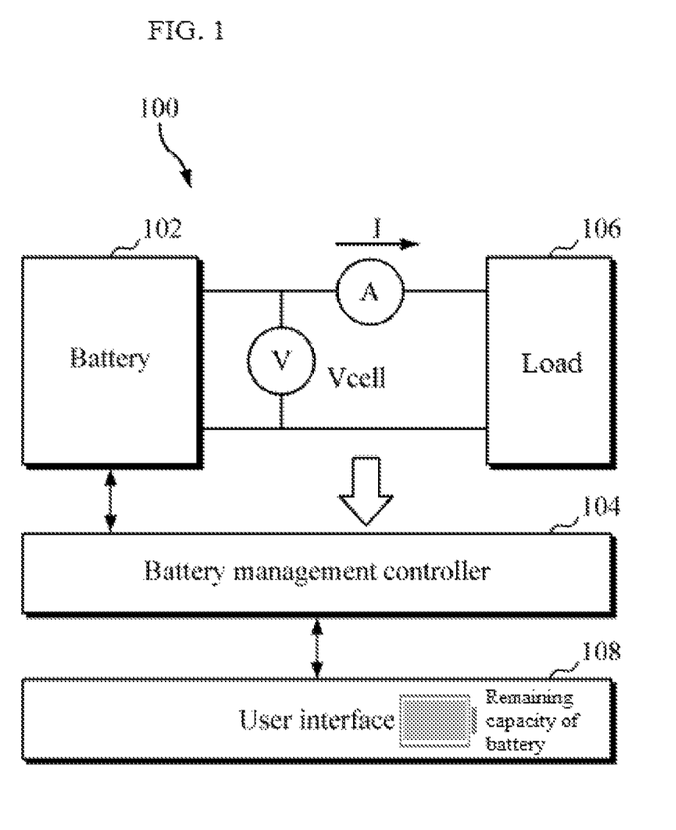
FIG. 1 illustrates a battery system for predicting a State of Charge (SoC) of a battery based an Open Circuit Voltage (OCV) model, according to one or more embodiments.
Figure 2A:
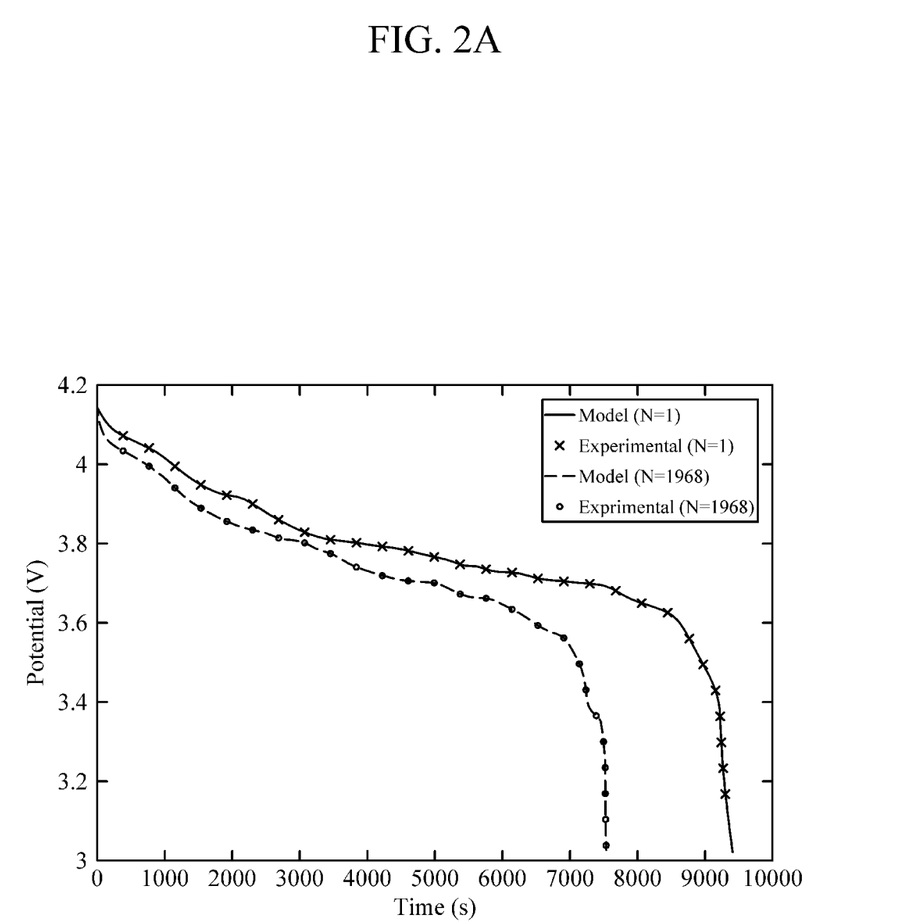
FIGS. 2a through 2d illustrate graphical analysis of sample results for a LCO/C (Lithium Cobalt) battery system, according to one or more embodiments.
Figure 2B:
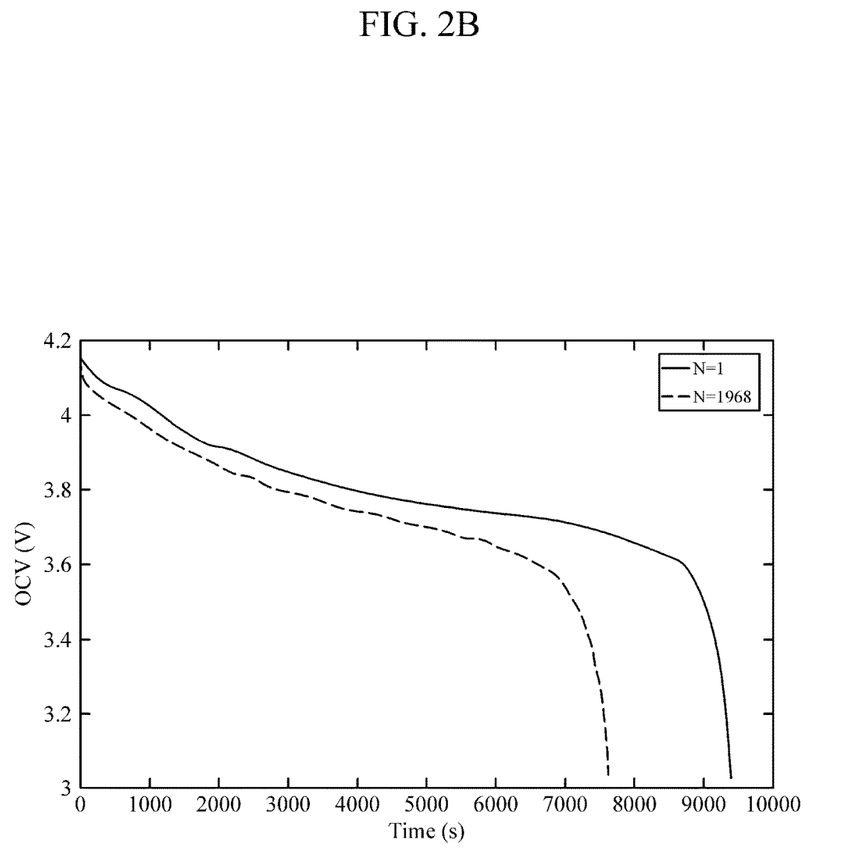
Figure 2C:
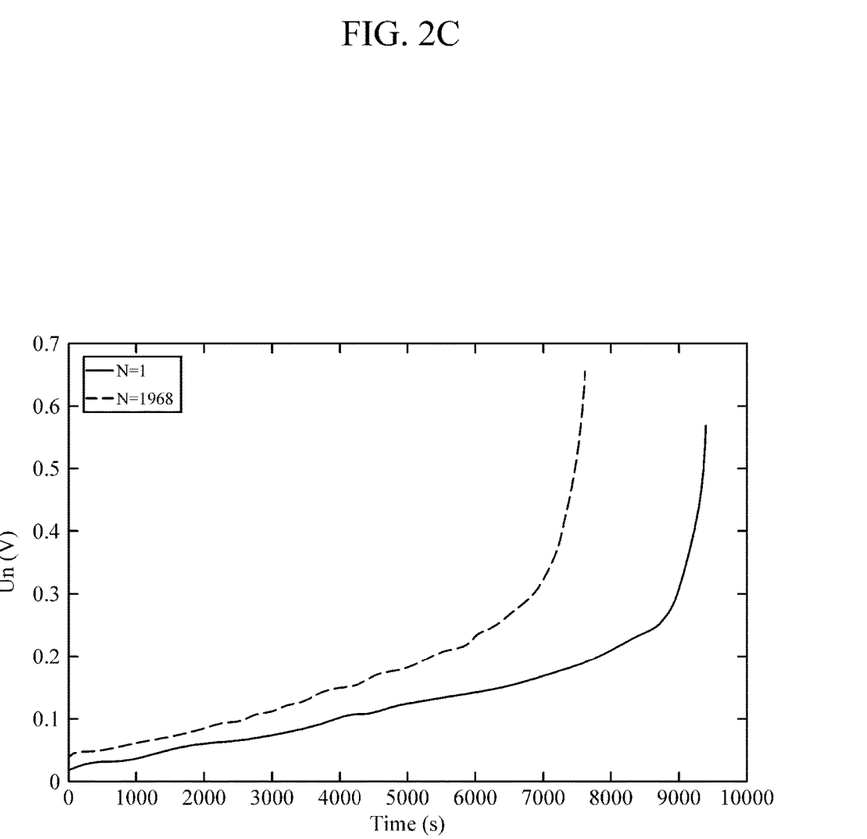
Figure 2D:
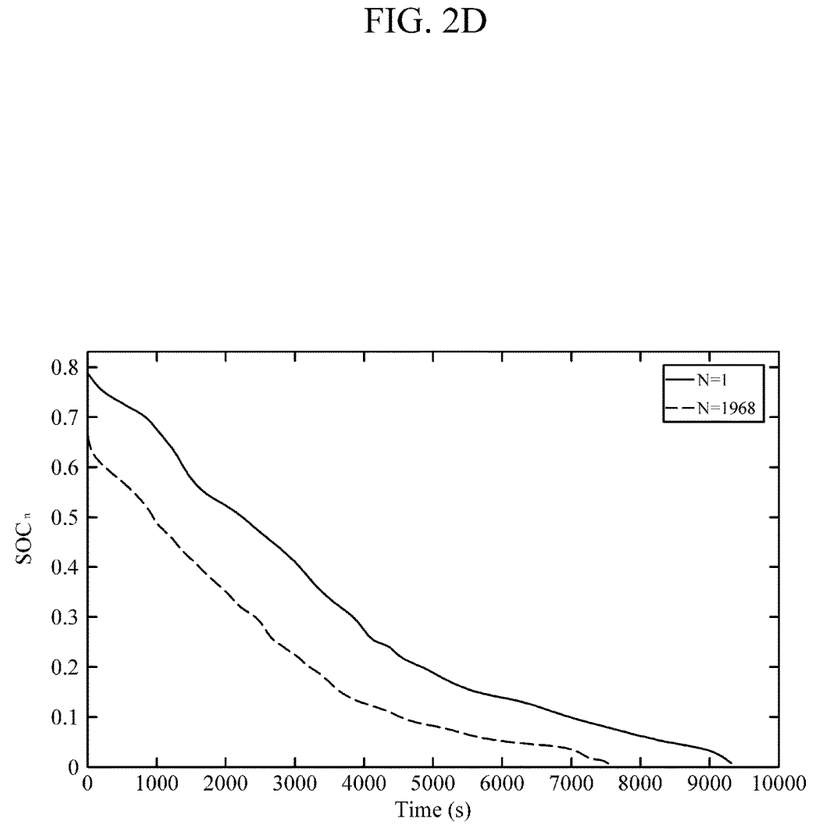
Figure 3:
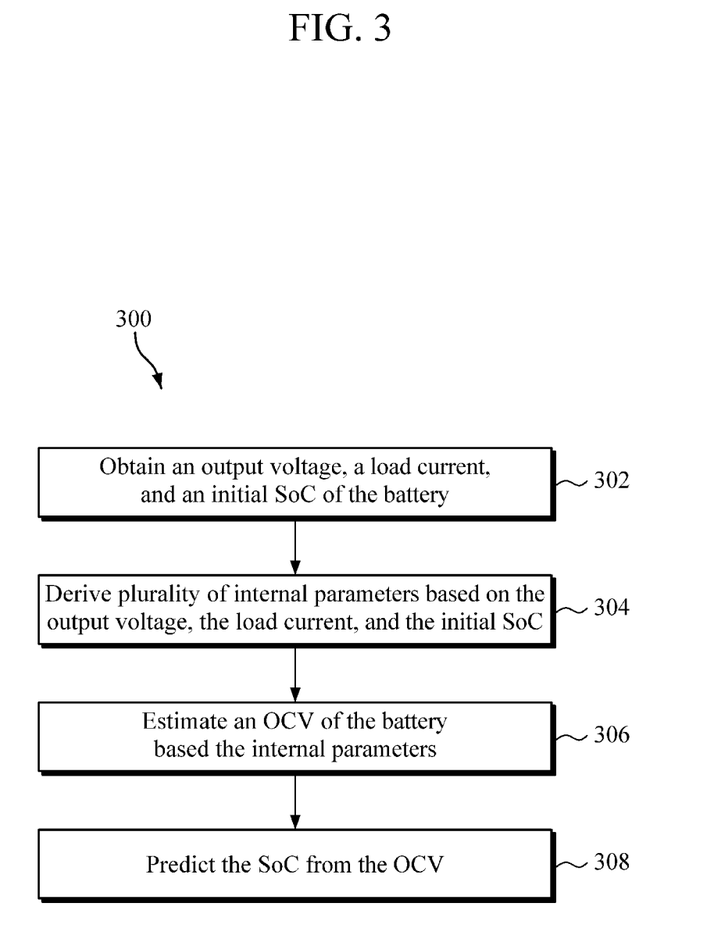
FIG. 3 is a flow diagram illustrating a method for predicting a State of Charge (SoC) of a battery based an Open Circuit Voltage (OCV) model, according to one or more embodiments.

Referring now to the drawings, and more particularly to FIGS. 1 through 3, where similar reference characters denote corresponding features consistently throughout the figures, there are shown embodiments.

FIG. 1 illustrates a battery system 100 for predicting a State of Charge (SoC) of a battery 102 based an Open Circuit Voltage (OCV) model, according to one or more embodiments. In an embodiment, the battery system 100 includes a battery 102 connected to a battery management controller 104 and a load 106. Further, the battery management controller 104 is connected to a User Interface (UI) 108 that provides an interface to indicate the battery health to the user in terms of real time SoC of the battery 102 and any change in initial capacity of the battery 102 with cycling. In an embodiment, the UI 108 includes a display, for example. The battery management controller 104 predicts the SoC of the battery 102 based on the OCV model. The OCV model is defined by plurality of internal parameters corresponding to the battery 102. The battery management module 104 derives the plurality of internal parameters from the input parameters that include the output voltage (Vcell), the load current (I) supplied by the battery 102 to the load 106, and an initial SoC of the battery 102. The input parameters are inputs of the battery management controller, for example. The initial SoC is an initial surface concentration of ions (for example, Li-ions in a Li-ion battery) in a positive electrode ($C_{n0}$), or an initial surface concentration of ions in a negative electrode ($C_{p0}$) of the battery 102. The initial SoC may be an indication of the SoC of battery 102 when unused or fresh. However, with aging of the battery, the battery management module provides the prediction of the real time SoC by using the input parameters such as Vcell during estimating OCV and internal parameters that are dependent on aging of the battery 102. The plurality of internal parameters include reaction fluxes at the positive electrode ($j_p$) and the negative electrode ($j_n$), interfacial potentials in an electrolyte phase at the positive electrode ($\phi_{2p}$) and the negative electrode ($\phi_{2n}$), reaction rates at the positive electrode ($j_{p0}$) and the negative electrode ($j_{n0}$). Further, the plurality of internal parameters include an open circuit potential of the positive electrode ($U_p$), a side reaction current density of the battery 102 ($j_s$), and a resistance ($R_f$) of a solid-electrolyte interphase (SEI) film formed at the negative electrode The battery management controller 104 is configured to derive the plurality of internal parameters based on one or more input parameters including $V_{cell}$, I, and initial SoC ($c_{n0}$ and $c_{p0}$). The mathematical analysis for the derivation of the plurality of internal parameters based on at least one of input parameters including $V_{cell}$, I, and initial SoC ($c_{n0}$ and $c_{p0}$) is explained based on the OCV model obtained from the equations provide below.

Input quantities measured include $V_{cell}$, I, $c_{n0}$ and $c_{p0}$.

The reaction fluxes at the positive electrode ($j_p$) and the negative electrode ($j_n$) may be calculated according to the below Equation 1, for example.

$$j_n = \frac{I}{a_n F l_n}, \; j_p = \frac{-I}{a_p F l_p} \qquad \text{Equation 1}$$

In Equation 1, $a_n$ and $a_p$ are the specific surface area of active materials in the negative and positive respectively. F represents the Faradays constant and has a value 96485 C mol$^{-1}$. $I_n$ and $I_p$ are the length of the negative and positive electrodes respectively.

Further, interfacial mass fluxes at the positive electrode ($q_{2ip}$) and the negative electrode ($q_{2in}$) and interfacial electrolyte concentrations at the positive electrode ($c_{2ip}$) and the negative electrode ($c_{2in}$) are calculated, e.g., using state of art techniques. These parameter $q_{2ip}$, $q_{2in}$, $c_{2in}$, and $c_{2ip}$ are used herein to obtain electrolyte phase potentials or the interfacial potentials in electrolyte phase at the positive electrode ($\phi_{2p}$) and the negative electrode ($\phi_{2n}$), such as through the below Equations 2 and 3, for example.

$$\phi_{2n} = \phi_{2in} + 2\Theta \log\left(\frac{c_{2n}(x=0)}{c_{2in}}\right) + \frac{Il_n}{2K_{2n}} \qquad \text{Equation 2}$$

$$\phi_{2p} = \phi_{2ip} + 2\Theta \log\left(\frac{c_{2p}(x=L)}{c_{2ip}}\right) - \frac{Il_p}{2K_{2p}} \qquad \text{Equation 3}$$

In Equation 3 and Equation 4, $c_{2n}$ and $c_{2p}$ are the scaled average electrolyte concentration at the negative and positive electrode. $I_n$ and $I_p$ are the length of the negative and positive electrodes respectively. $K_{2n}$ and $K_{2p}$ are electrolyte conductivities in the negative and positive electrodes respectively. $\phi_{2in}$ and $\phi_{2ip}$ are interfacial potentials.

The results of Equations 2 and 3 may be used to calculate the side reaction current density ($j_s$), such as through the below Equations 4 and 5, for example, assuming an initial value of ($\phi_{1n}$). Here, ($R_f$) is the resistance of an SEI film ($\delta f$) formed on the negative electrode.

$$j_s = \frac{-j_{s0}}{F} \times \exp\left(-\frac{\alpha_c F}{RT}(\phi_{1n} - \phi_{2n} - U_{sr} - j_n R_f F)\right) \qquad \text{Equation 4}$$

$$\frac{d\delta_f}{dt} = -\frac{j_{sr} M_f}{\rho_f} \qquad \text{Equation 5}$$

$$R_f = R_{f0} + \frac{\delta_f}{\kappa_f}$$

In Equation 4 and Equation 5, $j_s$ is the side reaction current. $j_{s0}$ is the initial value of the side reaction current. $\alpha_c$ is the charge transfer coefficient. R represents the gas constant. The gas constant value is 8.3144598(48) J mol−1 K−1. T is the cell temperature in K. F represents the Faradays constant and has a value 96485 C mol−1. $\phi_{1n}$ and $\phi_{2n}$ are the solid and liquid phase potentials respectively. $j_n$ is the reaction rate at the negative electrode. $R_f$ is the SEI film resistance. $\delta_f$ is the SEI film thickness. $M_f$ is molecular weight of the SEI film. $K_f$ is the conductivity of the SEI film. $\rho_f$ is the density of the SEI film.

The below Equation 6 can then be derived.

$$j_{int} = j_n - j_s \qquad \text{Equation 6:}$$

Here, $j_n$ and $j_p$ represent the reaction flux and $j_s$ represents the side reaction rate. The concentration gradients within solid phase may be further calculated as in the below Equation 7, for example.

$$\frac{dc_{1n}}{dt} = -\frac{45 j_{int}}{2R_n^2} - \frac{30 D_{1n} c_{1n}}{R_n^2}, \quad \frac{dc_{1p}}{dt} = -\frac{45 j_p}{2R_p^2} - \frac{30 D_{1p} c_{1p}}{R_p^2}$$

In Equation 7, $R_n$ and $R_p$ are the particle radius at the anode and cathode respectively. $c_{1n}$ and $c_{1p}$ are scaled average radial gradient concentrations in the anode and cathode respectively. $D_{1n}$ and $D_{1p}$ are the solid diffusivities of the electrodes. $j_{int}$ is the intercalation current.

From the input values of $c_{n0}$ and $c_{p0}$ the reaction rates at the positive electrode ($j_{p0}$) and the negative electrode ($j_{n0}$) and the surface concentration of ions in the electrodes (e.g., Li-ions in electrodes of the Li-ion battery) may be calculated as provided in the below Equations 8, 9, and 10, for example.

$$c_{1n} = c_{sn} + \frac{r_n}{35 D_{1n}} j_n - \frac{8 r_n}{35} c_{1m}, \quad \text{Equation 8}$$

$$c_{1p} = c_{1p0} + \frac{l_n \varepsilon_{1n}}{l_p \varepsilon_{1p}} (c_{1n0} - c_{1n})$$

$$c_{sp} = c_{1p} - \frac{r_p}{35 D_{1p}} j_p + \frac{8 r_p}{35} c_{1pr} \quad \text{Equation 9}$$

$$j_{n0} = k_n (c_{smaxn} - c_{sn})^{0.5} c_{sn}^{0.5} c_2^{0.5}, \quad \text{Equation 10}$$

$$j_{p0} = k_p (c_{smaxp} - c_{sp})^{0.5} c_{sp}^{0.5} c_2^{0.5}$$

In Equation 9 and Equation 10, $c_{1n}$ is the Scaled average solid phase concentration at the anode. $c_{1p}$ is the Scaled average solid phase concentration at the cathode. $r_n$ and $r_p$ are the particle radius at the anode and cathode respectively. $k_p$ and $k_n$ are the surface reaction rate constant at the cathode and anode respectively. $c_2$ is the electrolyte concentration. $c_{smaxn}$ and $c_{smaxp}$ are the maximum solid phase concentrations at the anode and cathode respectively. $I_n$ and $I_p$ are the length of the negative and positive electrodes respectively. $\varepsilon_n$ and ep are the volume fractions of active material in the electrolyte. $c_{1m}$ and $c_{1rp}$ are scaled average radial gradient concentrations in the anode and cathode respectively. $D_{1n}$ and $D_{1p}$ are the solid diffusivities of the electrodes.

Here, ($c_{sp}$ and $c_{sn}$) represent a surface concentration of ions in the positive electrode and the negative electrode, respectively, and ($c_{sn}$) represents the surface concentration of ions in the negative electrode. Upon deriving the plurality of internal parameters, the battery management module 104 is configured to use these internal parameters to estimate the OCV using the OCV model, as a physics based model, such as provided in the below Equation 11, for example. Here, the quantities obtained through equations 1 to 10 may be substituted in the example Equation 11 for the OCV model.

$$OCV = -\left[ -V_{cell} + \phi_{2p} + \frac{2RT}{F} \sinh^{-1}\left(\frac{j_p}{2 j_{p0}}\right) - \phi_{2n} - j_n R_f F - \frac{2RT}{F} \sinh^{-1}\left(\frac{j_n - j_s}{2 j_{n0}}\right) \right] \quad \text{Equation 11}$$

In Equation 11, Here $V_{cell}$ is the cell voltage. R represents the Gas constant. The gas constant value is 8.3144598(48) J mol−1 K−1, and T is the cell temperature in K. F represents the Faradays constant and has a value 96485 C mol−1

Equation 11 may explain estimation of the OCV for any measured value of current and voltage. The applicability of this method is manifested during cycling of batteries. The signatures in voltage and current on aging are mapped to change in OCV on degradation. Thus, the battery management module may provide a direct method of estimation of OCV while the battery is in use, e.g., when a device's onboard battery in sin use.

Upon estimating the OCV, the battery management controller 104 predicts the SoC using the functional dependence of the SoC on the OCV, such as provided below with Equation 12, for example.

$$U_n = U_p - OCV$$

where, $$U_p = f_p(c_{sp}) \quad \text{Equation 12:}$$

Where, $U_n$ is an open circuit potential of the negative electrode and $U_p$ is an open circuit potential of the positive electrode. The $U_p$ is derived from a surface concentration of ions in the positive electrode ($c_{sp}$) and the negative electrode ($c_{sn}$). Further, the surface concentration of ions in the negative electrode ($c_{sn}$) is derived from the initial surface concentration of ions in the negative electrode ($c_{n0}$) or a current surface concentration of ions in the negative electrode ($c_{sn}$), such as provided in the below Equation 13, or both.

$$c_{sn} = f_n^{-1}(U_n) \quad \text{Equation 13:}$$

Where, $f_p$ and $f_n$ is the functional dependence of equilibrium potential of electrodes on the lithium concentration in the positive and negative electrode. With aging, OCV changes. This leads to change in $U_n$. This $U_n$ is used to calculate $c_{sn}$. In the next step, this $c_{sn}$ is used to obtain new value of $c_{sp}$ and in turn $U_p$.

The battery management controller 104 indicates the battery health to the user through the user interface 108. For example, the battery health may be indicated or displayed in terms of real time SoC of the battery 102, a remaining capacity of the battery, or change in initial capacity of the battery with cycling, or any combination thereof. The user interface 108 may be a display disposed in a dashboard of the vehicle, an instrument cluster of the vehicle, a Multifunction display means in the vehicle (in the instrument cluster and/or the dashboard), a device connected to the vehicle using a suitable means (such as WiFi Direct, Bluetooth, wired means and so on), an infotainment system of the vehicle, a display screen in the vehicle, or a Heads-up-Display (HUD) in the vehicle, or any combination thereof. Thus, the battery system 100 enhances the user experience by keeping the user updated about the status of the battery 102. In addition, as noted above, the user interface may be a display of any other device that depends on battery power, to provide such feedback about the respective battery's status.

Returning to FIG. 1, FIG. 1 shows a limited overview of the battery system 100. The battery system 100 may include plurality of other components or modules or units that directly or indirectly interact with the components or modules shown in FIG. 1. However, other components are not described here for brevity.

For simplicity and ease of understanding, FIG. 1 describes the battery system 100 for a single battery module. However, in an embodiment, the battery 102 can be a battery pack that includes plurality of battery modules or cells.

FIGS. 2a through 2d illustrate graphical analyses of sample results for the example battery system 100 with a Lithium Cobalt (LCO/C) battery, according to one or more embodiments and only as an example.

FIG. 2a illustrates the potential (V) versus time (t) for a fresh and an aged LCO/C cell calculated using the OCV model and compared with experimental data. The re-calculated potential shows a good match with the input experimental data at N=1 and N=1968. N represents the number of recharge cycles undergone by the LCO/C cell. Thus, N=1 represents a fresh battery and N=1968 represents an aged battery.

FIG. 2b illustrates equilibrium potential (V) for a fresh and an aged LCO/C cell calculated from experimental current and voltage data. The equilibrium potential is observed to be modified upon aging. The equilibrium potential is measured from the open current voltage.

FIG. 2c illustrates electrode equilibrium voltage $U_n$ obtained from calculated OCV data. This data also shows the capacity loss (reduction in SoC) upon aging. This can be used to estimate SoC using experimental data interpolation.

FIG. 2d illustrates the SoC varying with time for fresh and aged LCO/C cells. Upon onboard use during cell cycling, the battery management controller 104 may prevent the loss of useful cell capacity.

FIG. 3 is a flow diagram illustrating a method 300 for predicting a State of Charge (SoC) of the battery 102 based an Open Circuit Voltage (OCV) model, according to one or more embodiments. In an embodiment, and as only an example, the battery management controller 104 of FIG. 1 may perform operations 302 through 308.

At operation 302, the method 300 includes obtaining the output voltage ($V_{cell}$), the load current (I), and the initial SoC of the battery 102 (also referred as input parameters) for estimating the OCV. The $V_{cell}$ and load current can be measured using the state of art techniques, such as through sensors included with battery 102 or corresponding battery packs, depending on embodiment. The initial SoC, which is the initial surface concentration of ions (for example, Li-ions in a Li-ion battery) in the positive electrode ($C_{po}$) or the initial surface concentration of ions in the negative electrode ($c_{n0}$) of the battery 102, can be obtained from the $V_{cell}$ that is measured from a fresh battery 102 with a maximum capacity.

Once the input parameters are obtained, at operation 304, the method 300 includes deriving a plurality of internal parameters based on the output voltage of the battery 102, the load current supplied to the load 106 by the battery 102, and the initial SoC of the battery 102. The plurality of internal parameters include the reaction fluxes at the positive electrode ($j_p$) and the negative electrode ($j_n$), the interfacial potentials in an electrolyte phase at the positive electrode ($\phi_{2p}$) and the negative electrode ($\phi_{2n}$), and the reaction rates at the positive electrode ($j_{p0}$) and the negative electrode ($j_{n0}$). Further, the plurality of parameters include the open circuit potential of the positive electrode ($U_p$), the side reaction current density ($j_s$) of the battery 102, and the resistance ($R_f$) of the solid-electrolyte interphase (SEI) film formed at the negative electrode. The mathematical analysis for deriving the internal parameters is explained above in conjunction with FIG. 1 and is not repeated for brevity. Other intermediate parameters are derived to derive the internal parameters as explained in the mathematical analysis of FIG. 1 described above. The interfacial potentials in the electrolyte phase at the positive electrode and the negative electrode ($\phi_{2n}$, $\phi_{2p}$) are dependent on the intermediate parameters such the interfacial electrolyte concentrations ($c_{2in}$, $c_{2ip}$) at the positive electrode and the negative electrode, and the interfacial mass fluxes at the positive electrode and the negative electrode ($q_{2in}$, $q_{2ip}$). Further, the interfacial electrolyte concentrations and interfacial mass fluxes are dependent on the load current (I). The method 300 includes obtaining the reaction fluxes at the positive electrode and the negative electrode from the load current. The method 300 includes obtaining the intermediate parameters such as the side reaction rate and the SEI film resistance ($j_s$, $R_f$) from the output voltage and the load current. The method 300 includes obtaining the reaction rates at the positive electrode and the negative electrode ($j_{n0}$, $j_{p0}$), and the open circuit potential of the positive electrode ($U_p$) from the surface concentration of ions in the positive electrode and the negative electrode ($c_{sn}$, $c_{sp}$). The surface concentration of ions in the negative electrode is derived from the initial surface concentration of ions in the negative electrode cn0 for the battery 102, when fresh (also referred as the initial or first charge/discharge cycle). However, the surface concentration of ions in the negative electrode is derived from the current surface concentration ions in the negative electrode ($c_{sn}$) for the battery 102, when the battery 102 is aging (also referred as the second and subsequent charge/discharge cycles).

At operation 306, the method 300 includes estimating the OCV of the battery 102 based on the internal parameters using the OCV model in equation 11, as described above. The method 300 includes estimating the OCV even during usage of the battery to include an effect of aging of the battery on the OCV.

At operation 308, the method 300 includes predicting the SoC from the OCV using the functional dependence of the SoC on the OCV of the battery 102. The SoC is predicted based on the OCV using the open circuit potential of the negative electrode $U_n$. This open circuit potential of the negative electrode is used to obtain the current surface concentration of the negative electrode ($c_{sn}$). Since, the OCV is calculated both for fresh battery and for the battery when in use, the method 300 includes predicting the SoC for the fresh and the aging battery.

Further, the method 300 includes indicating the battery health to the user through the user interface 108. The battery health may be indicated in terms of real time SoC of the battery 102, a remaining capacity of the battery, or change in initial capacity of the battery with cycling, or any combination thereof.

The various actions in method 300 may be performed in the order presented, in a different order or simultaneously. Further, in some embodiments, some actions listed in FIG. 3 may be omitted.

The apparatuses, units, modules, devices, interfaces and other components illustrated in FIG. 1 that performs the operations described herein with respect to FIG. 3 are implemented by hardware components. Examples of hardware components include controllers, sensors, generators, drivers, memories, comparators, arithmetic logic units, adders, subtractors, multipliers, dividers, integrators, and any other electronic components known to one of ordinary skill in the art. In one example, the hardware components are implemented by computing hardware, for example, by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIG. 3. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIG. 3 that perform the operations described herein with respect to FIG. 3 are performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer. While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method for predicting a State of Charge (SoC) of a battery, the method comprising:
   estimating an open circuit voltage of the battery based on an open circuit voltage model, where the open circuit voltage model is defined by internal parameters that are derived from a battery voltage of the battery, a load current of the battery for a load, or a first SoC of the battery, or any combination thereof,
   wherein the internal parameters comprise reaction fluxes at a positive electrode and a negative electrode, interfacial potentials in an electrolyte phase at the positive electrode and the negative electrode, reaction rates at the positive electrode and the negative electrode, and a resistance of a solid-electrolyte interphase film formed at the negative electrode; and
   predicting a second SoC, which comprises an effect of aging on the battery, based on the estimated open current voltage.

2. The method of claim 1, wherein the first SoC is an initial state of charge of the battery and is derived from an initial surface concentration of ions of a positive electrode or a negative electrode of the battery.

3. The method of claim 1, wherein the internal parameters further comprise
   an open circuit potential of the positive electrode and a side reaction current density of the battery.

4. The method of claim 3, wherein the reaction rates at the positive electrode and the negative electrode and the open circuit potential of the positive electrode are determined from a surface concentration of ions in the positive electrode and the negative electrode, wherein the surface concentration of ions in the negative electrode is determined from the determined initial surface concentration of ions in the negative electrode or a determined current surface concentration of ions in the negative electrode, or both.

5. The method of claim 1, wherein the interfacial potentials in the electrolyte phase at the positive electrode and the negative electrode are based on interfacial electrolyte concentrations at the positive electrode and the negative electrode and interfacial mass fluxes at the positive electrode and the negative electrode, wherein the interfacial electrolyte concentrations and interfacial mass fluxes are based on the load current.

6. The method of claim 1, wherein the reaction fluxes at the positive electrode and the negative electrode are based on the load current.

7. The method of claim 1, wherein the reaction rates and the solid-electrolyte interphase film resistance are determined from the battery voltage and the load current.

8. The method of claim 1, wherein the second SoC is predicted based on the open current voltage using open circuit potential of the negative electrode, wherein the open circuit potential of the negative electrode is used to determine the current surface concentration of the negative electrode.

9. The method of claim 1, further comprising displaying the second SoC and a remaining battery life of the battery on a user interface.

10. A battery system for predicting a State of Charge (SoC) of a battery, the battery system comprising:
a battery management controller; and
the battery connected to a load and the battery management controller,
wherein the battery management controller is configured to:
estimate an open circuit voltage of the battery based on an open circuit voltage model defined by internal parameters, wherein the internal parameters are determined from a battery voltage of the battery, a load current of the battery, or a first SoC of the battery, or any combination thereof and comprise reaction fluxes at a positive electrode and a negative electrode, interfacial potentials in an electrolyte phase at the positive electrode and the negative electrode, reaction rates at the positive electrode and the negative electrode and a resistance of a solid-electrolyte interphase film formed at the negative electrode; and
predict the second SoC, which comprises an effect of aging on the battery, from the open circuit voltage.

11. The battery system of claim 10, wherein the first SoC is an initial SoC of the battery and is derived from a determined initial surface concentration of ions in one of a positive electrode and a negative electrode of the battery.

12. The battery system of claim 10, wherein the internal parameters further comprise;
an open circuit potential of the positive electrode and a side reaction current density of the battery.

13. The battery system of claim 12, wherein the side reaction current density $j_s$ is defined by $$j_s = \frac{-j_{so}}{F} \times \exp\left(-\frac{\alpha_c F}{RT}(\phi_{1n} - \phi_{2n} - U_{sr} - j_n R_f F)\right),$$

wherein $j_{so}$ is an initial value of a side reaction current, $\alpha_c$ is a charge transfer coefficient, R is a gas constant, T is a cell temperature in K, F is a Faradays constant, $\phi_{1n}$ and $\phi_{2n}$ are solid and liquid phase potentials, respectively, $j_n$ is a reaction rate at the negative electrode, $U_{sr}$ an open circuit potential and $R_f$ is the SEI film resistance.

14. The battery system of claim 12, wherein the side reaction current density is based on exponentials of solid and liquid phase potentials, and a reaction rate at the negative electrode.

15. The battery system of claim 10, wherein the interfacial potentials in the electrolyte phase at the positive electrode and the negative electrode are determined based on interfacial electrolyte concentrations at the positive electrode and the negative electrode and interfacial mass fluxes at the positive electrode and the negative electrode, wherein the interfacial electrolyte concentrations and interfacial mass fluxes are determined based on the load current.

16. The battery system of claim 10, wherein the battery management controller is further configured to determine the reaction fluxes at the positive electrode and the negative electrode based on the load current.

17. The battery system of claim 10, wherein the battery management controller is configured to determine the reaction rates and the solid-electrolyte interphase film resistance based on the battery voltage and the load current.

18. The battery system of claim 12, wherein the battery management controller is further configured to determine the reaction rates at the positive electrode and the negative electrode and the open circuit potential of the positive electrode based on a surface concentration of ions in the positive electrode and the negative electrode, wherein the surface concentration of ions in the negative electrode is derived from the determined initial surface concentration of ions in the negative electrode or a determined current surface concentration of ions in the negative electrode, or both.

19. The battery system of claim 10, wherein the battery management controller is further configured to predict the second SoC based on the open circuit voltage using open circuit potential of a negative electrode, wherein the open circuit potential of the negative electrode is used to determine the current surface concentration of the negative electrode.

20. The battery system of claim 10, further comprising a display, wherein the battery management controller is further configured to display the second SoC and a remaining battery life of the battery on a user interface of the display.

21. The battery system of claim 10, wherein the battery management controller is further configured to predict the second SoC of the battery by further predicting a load on the battery from the battery management controller.

* * * * *